United States Patent
Lai et al.

(10) Patent No.: US 7,643,576 B2
(45) Date of Patent: Jan. 5, 2010

(54) DATA-SIGNAL-RECOVERY CIRCUIT, DATA-SIGNAL-CHARACTERIZING CIRCUIT, AND RELATED INTEGRATED CIRCUITS, SYSTEMS, AND METHODS

(75) Inventors: Benny Wing Hung Lai, Fremont, CA (US); Allan Liu, San Jose, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 872 days.

(21) Appl. No.: 10/848,781

(22) Filed: May 18, 2004

(65) Prior Publication Data

US 2005/0259764 A1 Nov. 24, 2005

(51) Int. Cl.
*H04L 25/06* (2006.01)
(52) U.S. Cl. .................... 375/317; 375/316
(58) Field of Classification Search .............. 375/317
See application file for complete search history.

(56) References Cited

U.S. PATENT DOCUMENTS

| | | | | |
|---|---|---|---|---|
| 4,799,240 A * | 1/1989 | Yoshida | ............ | 375/355 |
| 5,574,756 A * | 11/1996 | Jeong | ............ | 375/376 |
| 6,178,213 B1 * | 1/2001 | McCormack et al. | ...... | 375/355 |
| 6,728,311 B1 * | 4/2004 | Waschura et al. | ........ | 375/224 |
| 6,799,131 B1 * | 9/2004 | Steiner et al. | ......... | 702/107 |
| 7,099,424 B1 * | 8/2006 | Chang et al. | .......... | 375/370 |
| 7,218,868 B2 * | 5/2007 | Ahn et al. | ............. | 399/13 |
| 2002/0176518 A1 * | 11/2002 | Xu | ................... | 375/317 |
| 2003/0031282 A1 | 2/2003 | McCormack et al. | | |
| 2003/0048859 A1 * | 3/2003 | Wedding | ............. | 375/317 |
| 2003/0065993 A1 * | 4/2003 | Kaji | ................... | 714/704 |
| 2003/0099307 A1 * | 5/2003 | Wu | ................... | 375/317 |
| 2004/0022339 A1 * | 2/2004 | Nakao | ............... | 375/376 |
| 2004/0146119 A1 * | 7/2004 | Weiner et al. | .......... | 375/317 |
| 2005/0201491 A1 * | 9/2005 | Wei | ................... | 375/326 |
| 2005/0232386 A1 * | 10/2005 | Mitsumoto | ........... | 375/376 |

OTHER PUBLICATIONS

Altera, Using Pre-Emphasis and Equalization with Stratix GX, Sep. 2003, ver 1.0.*

* cited by examiner

*Primary Examiner*—Shuwang Liu
*Assistant Examiner*—Kenneth Lam

(57) ABSTRACT

A data-signal-recovery circuit includes a flip-flop and a controller. The flip-flop has an adjustable sampling threshold, and, in response to a sampling clock, is operable to generate a recovered digital signal having a first level if an input data signal is above the threshold and having a second level if the input data signal is below the threshold. The controller is operable to adjust the threshold and phase shift of the sampling clock. Because the flip-flop has an adjustable sampling threshold, one can calibrate the flip-flop to the characteristics of the eye pattern at the flip-flop's input node.

14 Claims, 6 Drawing Sheets

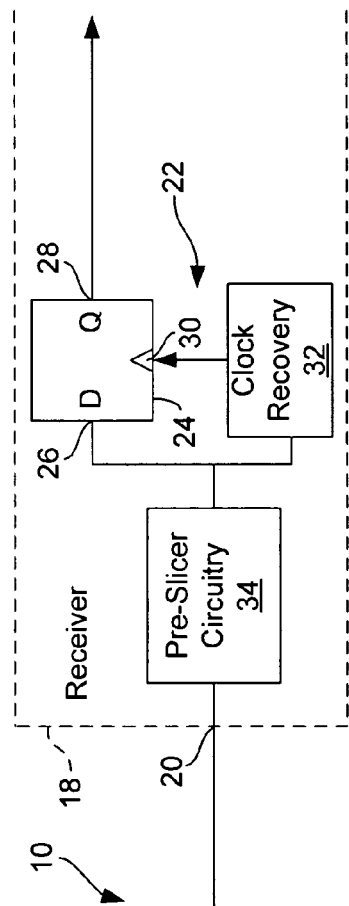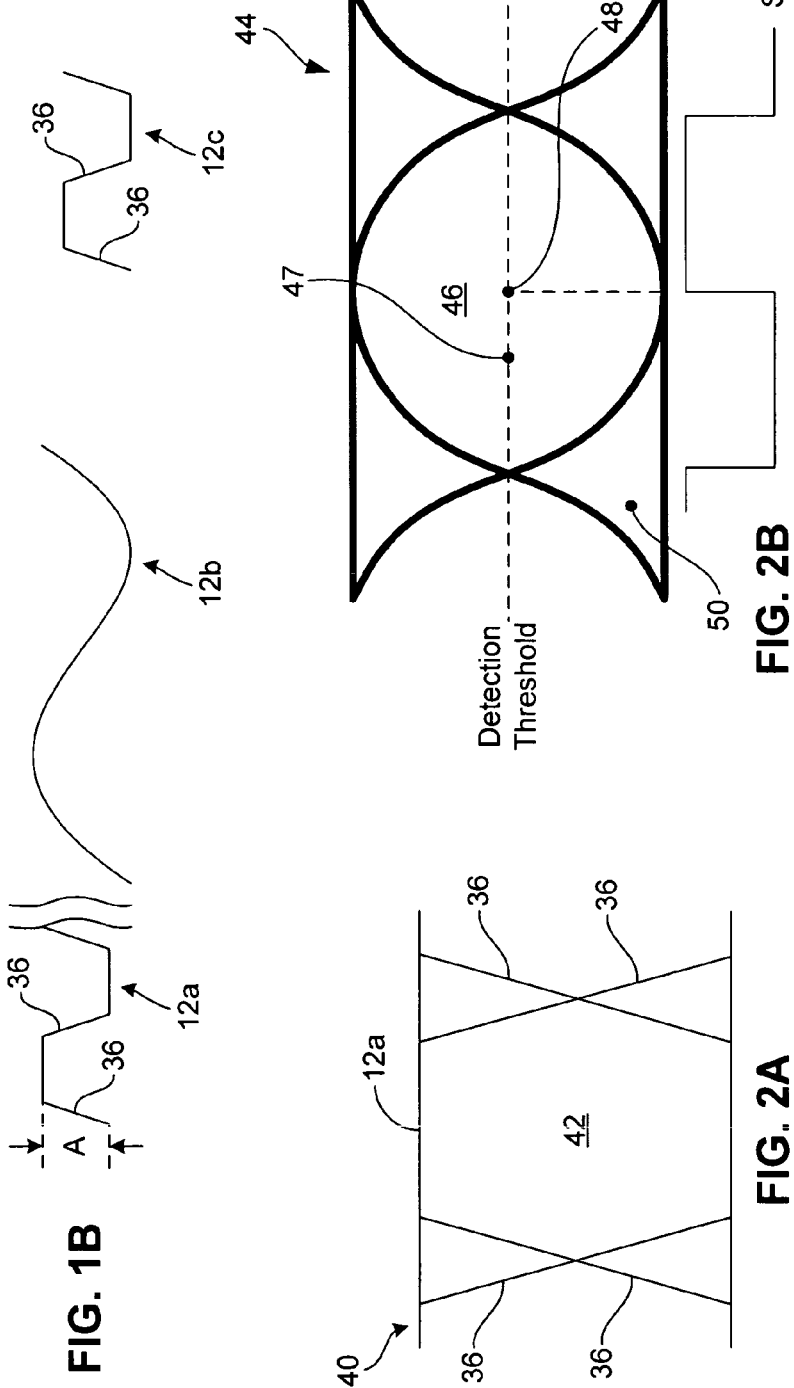

DATA-SIGNAL-RECOVERY CIRCUIT, DATA-SIGNAL-CHARACTERIZING CIRCUIT, AND RELATED INTEGRATED CIRCUITS, SYSTEMS, AND METHODS

BACKGROUND

In today's high-frequency digital communication systems, a receiver typically recovers from the received data signal a "clean" data signal, from which processing circuitry can accurately recover the data carried by the signal. Many communication media such as metal wires (e.g., twisted pair), coaxial cables, PC board traces, or the atmosphere (i.e., wireless communications) are "lossy," particularly at high frequencies. That is, these communication media degrade the signals that they carry, particularly the high-frequency components of these signals. A digital signal typically has relatively sharp transition edges, and thus typically includes signal components having relatively high frequencies. Consequently, in addition to attenuating a digital signal, a lossy communication medium may corrupt the phase of and/or smoothen the signal's transition edges, and one or more of these degradations may cause the processing circuitry to recover erroneous data from the signal. Therefore, in addition to amplifying the received digital signal, a high-frequency-digital-signal receiver typically re-sharpens the transition edges and reduces or removes the phase jitter from these edges to allow the processing circuitry to more accurately recover the data.

FIG. 1A is a block diagram of a conventional high-frequency digital communication system 10, and FIG. 1B is a diagram of a high-frequency digital signal 12 at three points (12a, 12b, 12c) within the system.

Referring to FIG. 1A, the system 10 includes a transmitter 14 for generating the digital signal 12a (FIG. 1B) on an output terminal 15, a lossy transmission medium 16 for carrying the transmitted digital signal, and a receiver 18 for receiving the degraded digital signal from the medium 16, for recovering a logic signal and the data carried by the logic signal, and for processing the recovered data. For example, the transmitter and receiver 14 and 18 may be two computers networked via the medium 16, which may be a PC board trace, fiber-optic or copper cable. The receiver 18 includes an input terminal 20 for receiving the degraded digital signal from the medium 16, and includes a sampler 22 for recovering a clean digital signal from the degraded digital signal. The sampler 22 includes a D flip-flop 24 having input and output nodes 26 and 28 and a clock node 30, and includes a circuit 32, which recovers a sample clock from the degraded data signal and provides the sample clock to the D flip-flop. The receiver 18 may also include pre-sampler circuitry 34, such as a preamplifier, input equalizer, or demodulator.

Referring to FIGS. 1A and 1B, the operation of the communication system 10 and the recovery of the clean digital signal by the sampler 22 is discussed. At the output terminal 15 of the transmitter 14, the data signal 12a has an amplitude A and relatively sharp transition edges 36. But the communication medium 16 degrades the signal such that at the input terminal 20 of the receiver 18, the amplitude of the degraded signal 12b is significantly lower than A, and the transition times of the edges 26 are reduced. Furthermore, the degraded signal 12b may include phase jitter that is not apparent in FIG. 1B. Fortunately, the sampler 22 generates a recovered digital signal 12c by effectively recovering from the degraded signal 12b the amplitude—the pre-sampler circuitry 34 may also assist with amplitude recovery, and the recovered amplitude may be other than A—the sharp edges 36, and the phase stability of the signal 12a. Specifically, the D flip-flop 24 has a trigger, i.e., detection, threshold. In response to each sampling edge—here the rising edge—of the sample clock, the flip-flop 24 generates on its output node 28 the recovered digital signal 12c having a logic 1 level if the amplitude of the degraded signal 12b at the flip-flop's input node 26 is higher than the detection threshold, and generates the recovered digital signal having a logic 0 level if the amplitude of the degraded signal is lower than the detection threshold. Consequently, the processing circuitry (not shown in FIG. 1A) can more accurately recover the data from the recovered signal 12c than it can from the degraded signal 12b.

To optimize the accuracy with which the sampler 22 generates the recovered digital signal 12c, one may determine the characteristics of the degraded data signal 12b at the input terminal 20 of the receiver 18, and calibrate the sampler to these characteristics.

Referring to FIGS. 2A and 2B, one may characterize a data signal by the size and shape of its "eye."

FIG. 2A is an eye pattern 40 of the data signal 12a of FIG. 1B at the output terminal 15 of the transmitter 14. The eye pattern 40 is the superposition of these data sequences back on itself over time, at its bit period The region 42 bounded by the rising/falling edges 36 is the eye opening of the pattern 40.

Similarly, FIG. 2B is an eye pattern 44 of the degraded data signal 12b of FIG. 1B at the input terminal 20 of the receiver 18. The region 46 bounded by the smoothened rising/falling edges is the eye opening of the pattern 44.

Referring to FIGS. 2A and 2B, one can see that the degradation (i.e., attenuation, transition-edge smoothening, and phase jitter) that the medium 16 imparts to the data signal 12a causes the eye 46 of the degraded data signal 12b to be significantly smaller both in voltage and in time than the eye 42 of the signal 12a. The thicker boundary of the eye pattern 44 is caused by amplitude and phase jitter. That is, the amplitude and phase jitter experienced by the degraded signal 12b causes multiple eye patterns to overlay one another at slightly different amplitudes and phases, thus making the signal-trace lines to appear thicker than those in FIG. 2A (the signal 12a experiences significantly less amplitude and phase jitter). Consequently, the thicknesses of the eye-pattern boundary are a rough measure of the ranges of the amplitude and phase jitter experienced by the degraded signal 12b.

Still referring to FIGS. 2A and 2B, in mathematical terms, the eye pattern 44 represents the randomized distribution of the phase (time, i.e., the horizontal "X" dimension) and amplitude (amplitude, i.e., the vertical "Y" dimension) of the signal caused by noise and other degradation of the signal. More specifically, the eye opening 46 is bounded by randomized traces; and could be characterized as contours of varying probabilities. So one can characterize the pattern 44 in terms of probability of the trace lines passing to one side or another of a particular point when the signal represents a particular logic level. As an example, the point 47 away from the optimal center, is analyzed. When the signal represents a logic 1, at the rising edge of the sample clock (which is aligned to the point 47 in the X or time dimension), the probability that the trace line, and thus the signal amplitude, is greater than the detection threshold (which is aligned to the point 47 in the Y or voltage dimension) may be greater than 99%. Similarly, assuming a symmetrical system, when the signal represents a logic 1, at the rising edge of the sample clock the probability that the signal amplitude is less than the detection threshold is less than 1%. This indicates that less than 1% of the time, the sampling circuitry (not shown in FIGS. 2A and 2B) will erroneously characterize the sampled data. If this error rate is too high, then one can attempt to find another sampling point that provides a lower error rate. As discussed below, one typically attempts to determine the "optimum" sampling point that provides the lowest error rate. The optimum sampling point is often, but is not always, near the center point 48 of the eye 46. In this example, the bit-error-rate (BER) is effectively 1 in 100, or BER=$10^{-2}$. In a typical communication system, the acceptable BER is well below $10^{-9}$.

Referring to FIGS. 1A and 2B, to generate the recovered digital signal 12c having the lowest error rate possible, one calibrates the sampler 22 to best match the characteristics of the eye pattern 44 of the degraded data signal 12b. Typically, one performs this calibration by adjusting the phase of the sample clock and the detection threshold of the D flip-flop 24 such that the sampling point 47, which is the intersection of the sampling edge—here the rising edge—of the sample clock and the sampling threshold, is as close as possible to the optimum sampling point, which in this example is the center of the eye 46. For illustration, consider the sampling point 47, which is not at the center of the eye 46. Because of relatively large (beyond that indicated by the eye-pattern traces in FIG. 2A) amplitude and phase jitter intermittently experienced by the degraded signal 12b the signal maybe above or below the threshold at point 47, thus giving rise to a possible errors in the recovered digital signal 12c. For example, if signal 12b is logically low, and jitter causes this signal to be temporarily located at a position above the sampling threshold of point 47, then the sampler 22 will erroneously generates the recovered digital signal 12c having a logic 1 level. Consequently, the farther the sampling point 47 is from the optimum sampling point 48 (here the center of the eye), the higher the chance of error in, and thus the higher the error rate of the recovered digital signal 12c. Conversely, the closer the sampling point 47 to the optimum sampling point 48 of the eye 46, the lower the chance of error in, and thus the lower the error rate of, the recovered data signal 12c. Furthermore, changes in the operating parameters (e.g., temperature) of the sampler 22 may shift the sampling point 47 farther from the optimum sampling point 48 of the eye 46. Therefore, to maximize the safety margin and thus to minimize errors in the recovered data signal 12c, one typically desires the sampling point 47 to be as close as possible to the optimum sampling point 48, which in this example is the center of the eye 46.

Unfortunately, measuring the eye 46 at the input terminal 20 of the receiver 18 and manually calibrating the sampler 22 in response thereto is wrought with many problems. For example, the eye 46 may be different than the eye (not shown) at the input node 26 of the D flip-flop 24, particularly where the receiver 18 includes the pre-sampler circuitry 34. Therefore, aligning the sampling point 47 with the center of the eye 46 at the input terminal 20 is no guarantee that the point 47 is also aligned with the center of the eye at the input node 26, and, thus, such alignment may not provide an acceptable error rate for the recovered digital signal 12c. Furthermore, the characteristics (e.g., shape, probability distribution) of the eye 46, the detect threshold of the flip-flop 24, and the phase of the sample clock may drift over time, thus requiring periodic manual recalibration of the sampling point 47. Or, noticeable drift may occur during operation of the receiver 18, and may thus increase the error rate of the recovered digital signal 12c. In a severe situation, the error rate may increase so much as to cause the receiver 18 to fail.

Still referring to FIGS. 1A and 2B, some manufacturers have proposed including in the receiver 18 circuitry (not shown) for measuring the eye of the degraded signal 12b at a node inside the receiver, and calibrating the sampler 22 according to this internal eye.

But this proposed solution has several limitations. For one, although this proposed circuitry within the receiver 18 measures the eye at a node that is electrically closer to the flip-flop input node 26 than the input terminal 20 is, this internal eye may still be different than the eye at the node 26. Furthermore, the proposed circuitry is single-ended, and thus cannot be incorporated in differential receivers. In addition, the proposed circuitry samples each degraded data signal to determine the boundary of the data eye. In many circumstances, this rate of sampling may be unnecessary, and thus a waste of power.

SUMMARY

In one embodiment of the invention, a data-signal-recovery circuit includes a flip-flop and a controller. The flip-flop has an adjustable threshold, and, in response to a sample clock, is operable to generate a recovered digital signal having a first level if an input data signal is above the threshold and having a second level if the input data signal is below the threshold. The controller is operable to adjust the threshold and phase shift of the sample clock. The flip-flop may also be capable of receiving a differential data input, as well as a differential threshold input.

Because the flip-flop has an adjustable threshold, one can calibrate the flip-flop to the characteristics of the eye pattern at the flip-flop's input node.

In another embodiment of the invention, a circuit for characterizing a data signal includes a flip-flop and a controller. The flip-flop has an adjustable threshold, and, in response to a sampling signal, is operable to generate a test digital signal having a first level if an input data signal is above the threshold and having a second level if the input data signal is below the threshold. The controller is operable to sweep the phase of the sampling signal through a first range, to sweep the threshold through a second range, to detect an error when the test digital signal has a predetermined relationship to a recovered digital signal, and to identify a boundary of an eye of the input data signal in response to an error-detection rate.

Because the flip-flop has an adjustable threshold, the circuit can identify the boundary of the eye for a given bit error rate, or BER, directly at the sampling flip-flop's input node, thus allowing a more accurate calibration of the sampling flip-flop.

In yet another embodiment of the invention, a circuit for characterizing a data signal includes a sampler and a controller. The sampler, in response to a first sampling signal, is operable to generate a test digital signal having a first level if an input data signal is above a threshold and having a second level if the input data signal is below the threshold. The controller is operable to sweep the phase of a second sampling signal through a first range, to generate the first sampling signal in response to predetermined edges of the second sampling signal, to detect an error when the test digital signal has a predetermined relationship to a recovered digital signal, and to identify a boundary of an eye of the input data signal in response to an error-detection rate.

Because it generates the first sample clock from predetermined edges of a second sample clock, the controller can cause the sampler to generate the test digital signal at intervals that may differ from the periodic interval of the data clock.

Furthermore, in the above embodiments, one or more of the respective flip-flops, controllers, and sampler may be operable to receive and/or generate differential signals.

BRIEF DESCRIPTION OF THE DRAWINGS

The invention, together with advantages thereof, may best be understood by making reference to the following non-limiting description of various embodiments thereof taken in conjunction with the accompanying drawings, in the several figures of which like referenced numerals identify like elements.

FIG. 1A is a block diagram of a conventional high-frequency data communication system.

FIG. 1B is a diagram of a data signal at various points in the communication system of FIG. 1A.

FIG. 2A is the eye pattern of the data signal of FIG. 1B at the output terminal of the transmitter of FIG. 1A.

FIG. 2B is the eye pattern of the data signal of FIG. 1B at the input terminal of the receiver of FIG. 1A.

DETAILED DESCRIPTION

Figure 3:
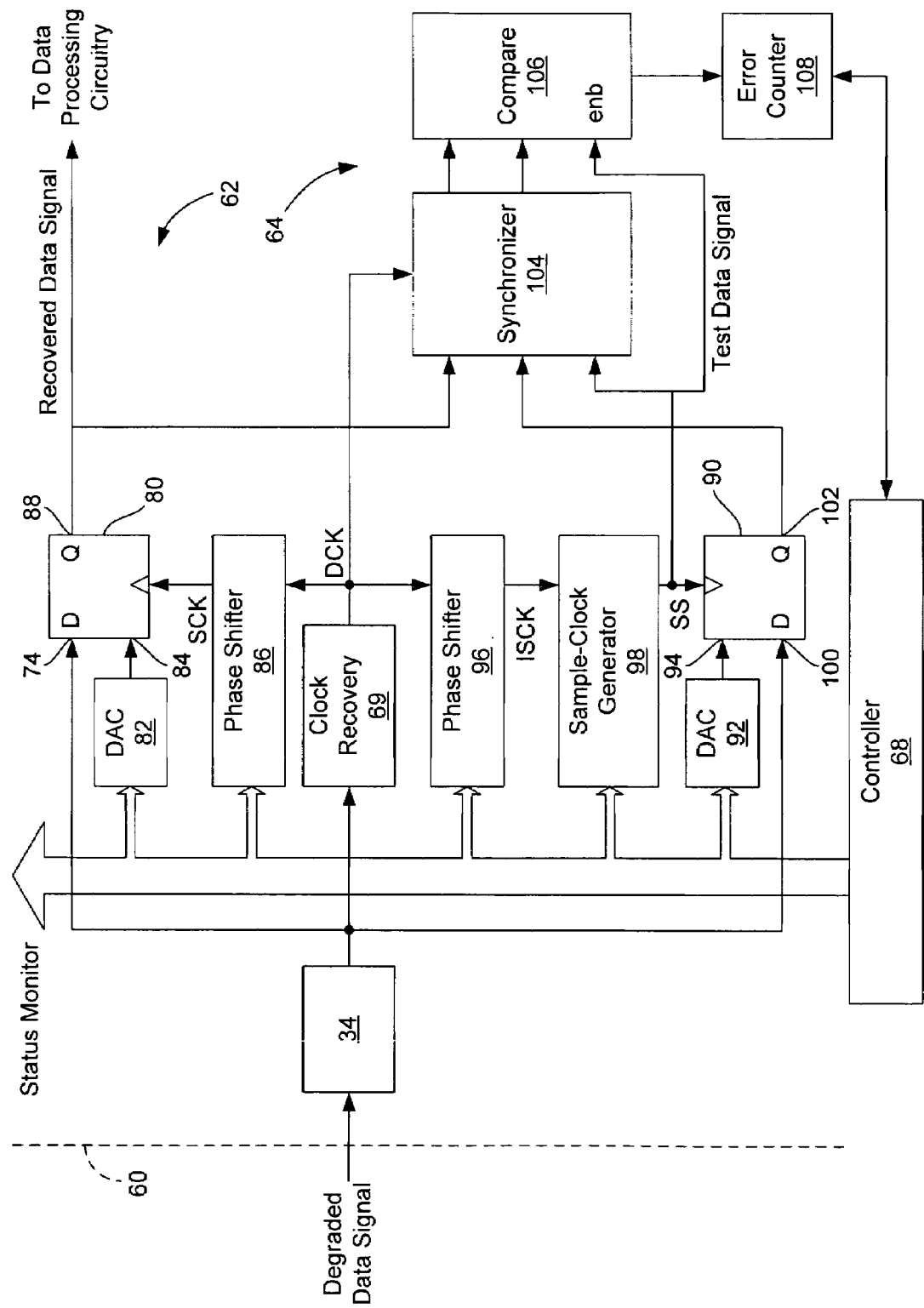
FIG. 3 is a block diagram of a receiver that includes data-signal-recovery and characterization circuits according to an embodiment of the invention.
Figure 4:
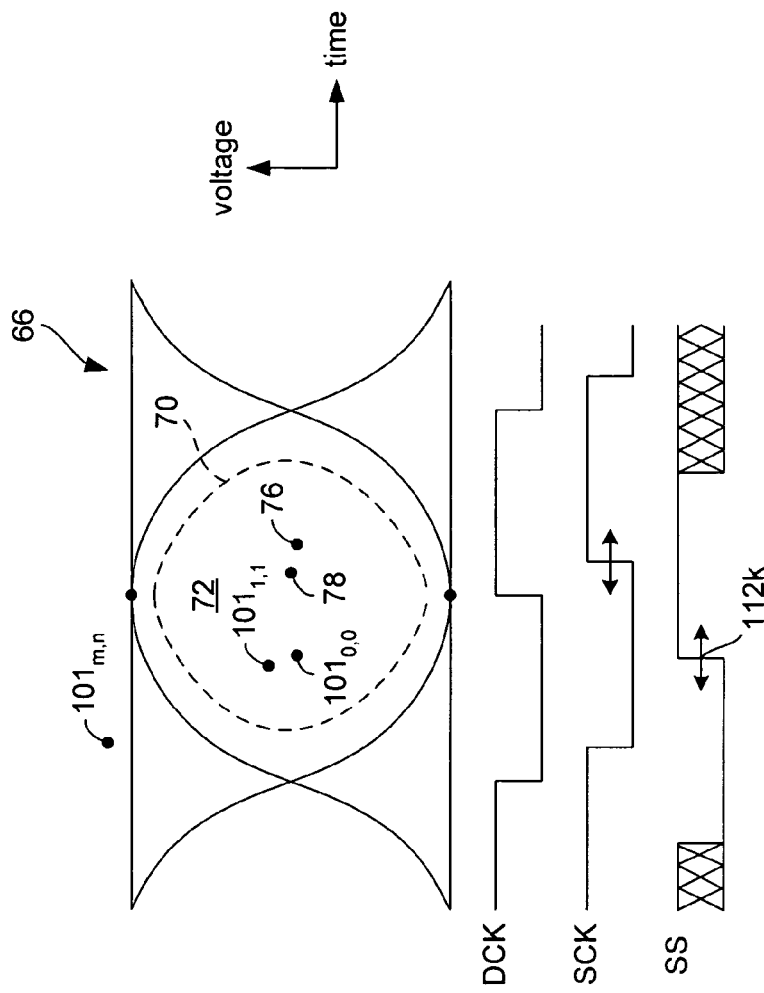
FIG. 4 is the eye pattern of the data signal at the input nodes of the flip-flops of FIG. 3.

FIG. 3 is a block diagram of a receiver 60, which includes the pre-sampler circuitry 34, a data-signal-recovery circuit 62, and a data-signal-characterization circuit 64, and FIG. 4 is an eye pattern 66 of the degraded data signal at the input nodes of the circuits 62 and 64 according to an embodiment of the invention. The receiver 60 may also include other circuits that are omitted for clarity.

Referring to FIG. 3, the data-signal-recovery and -characterization circuits 62 and 64 share a controller 68 and a data-clock (DCK) recovery circuit 69, although each of the circuits 62 and 64 may have its own respective controller and data-clock recovery circuit.

Referring to FIGS. 3 and 4, the controller 68 may be a processor, state machine, or any other type of control circuit, with associated memory, which, in response to information collected by the data-signal-characterization circuit 64, determines the "boundary" 70 of the data signal's eye 72 at an input node 74 of the data-signal-recovery circuit 62. As discussed above in conjunction with FIGS. 2A and 2B, the boundary 70 is not necessarily coincident with a scope trace of the eye 72, but is actually a theoretical boundary where an error rate transitions from being below an arbitrarily predetermined level to being above the predetermined level. In this discussion, the boundary 70 is the collection of sampling points at which a defined maximum acceptable error rate occurs. Thus, the boundary 70 is defined for a given bit error rate, or BER. Therefore, if a sampling point 76 is inside the eye 72 (i.e., inside the boundary 70), then the sampling error rate is below this given BER. Conversely, if the sampling point 76 is outside of the eye 72 (i.e., outside the boundary 70), then the sampling error rate is above this given BER. By measuring the error rates at a number of sampling points within the eye pattern 66, one can map the boundary 70, and thus characterize the eye 72. Knowing the boundaries 70 over several BER levels, one can extrapolate the sampling point corresponding to the lowest BER level. With this, one may manually calibrate the recovery circuit 62 such that the sampling point 76 (sampling threshold $TH_{SR}$ and the sampling edge of the sampling clock SCK) is at or near the optimum sampling point, which is often, but not always, the center 78 of the eye. Alternatively, the controller 68 may calibrate the recovery circuit 62 in this manner.

The data-clock recovery circuit 69 is a conventional circuit such as a phase-locked loop (PLL) or delay-locked loop (DLL) that recovers DCK, which is synchronous with the data bit rate. In this embodiment, the frequency of DCK is at the bit rate, such that each rising edge of DCK corresponds to one bit of the data signal.

Because the data-signal-characterization circuit 64 characterizes the eye 72 at the input node 74 of the data-signal-recovery circuit 62 and not at a preceding node in the data signal's path, one can more accurately calibrate the recovery circuit. Furthermore, the recovery circuit 62 and the characterization circuit 64 may be single-ended, partially differential, or fully differential circuits, and the characterization circuit may sample the data signal at intervals other than the period of the recovered data clock DCK. The recovery and characterization circuits 62 and 64 are discussed in more detail below.

Referring to FIG. 3, in addition to the shared controller 68 and data-clock recovery circuit 68, the data-signal-recovery circuit 62 includes a D flip-flop 80, which has the adjustable detection threshold $TH_{SR}$, a digital-to-analog converter (DAC) 82 for setting, via a node 84, $TH_{SR}$ to a level indicated by the controller, and a phase adjustment circuit 86 for generating the sampling clock SCK by shifting the phase of DCK by an amount indicated by the controller. The flip-flop au samples the degraded data signal at its D input node 74 and generates a recovered digital signal on a Q (non-inverted) output node 88. And in response to the controller 68, the DAC 82 and circuit 86 set $TH_{SR}$ and the sampling edge of SCK to desired levels, and thus set the sampling point 76 (FIG. 4) to a desired location within the eye 72 as measured at the input node 74.

Similarly, in addition to the shared controller 68 and data-clock recovery circuit 68, the data-signal-characterization circuit 64 includes a D flip-flop 90, which has an adjustable sampling threshold $TH_{SC}$, a DAC 92 for setting, via a node 94, $TH_{SC}$ to a level indicated by the controller, a phase adjustment circuit 96 for generating an intermediate sampling clock ISCK by shifting the phase of DCK by an amount indicated by the controller, and an optional generator 98 for generating sampling signal SS from ISCK. The flip-flop 90 samples the degraded data signal at its D input node 100 and generates a test digital signal on a Q output node 102. As further discussed below, to determine the boundary 70 of the eye 72 (FIG. 4) at the input node 100 (and thus at the input node 74 of the flip-flop 80), the controller 68 causes the DAC 92 and phase adjustment circuit 96 to sweep a sampling point 101 (FIG. 4) over voltage and time of the eye pattern 66 (FIG. 4). As discussed below, sweeping the sampling point 101 causes the test digital signal to include samples from many locations within the eye pattern 66 (FIG. 4), and the controller 68 uses these samples to determine the boundary 70 of the eye 72 at the flip-flop input nodes 74 and 100. Furthermore, as discussed below, the optional sample-signal generator 98 can generate SS having a different interval than DCK and ISCK to, e.g., reduce power consumption.

The data-signal-characterization circuit 64 also includes a synchronizer 104 for synchronizing the recovered digital signal and the test digital signal to DCK, a comparator 106 for comparing the levels of the synchronized recovered and test signals, and an error counter 108 to track the rate at which the test signal does not have an expected level relative to the level of the recovered signal.

Referring to FIGS. 3 and 4, the operation and cooperation of the data-signal-recovery and -characterizing circuits 62 and 64 are described according to an embodiment of the invention where the optional sample-signal generator 98 is omitted. In this embodiment, the phase adjustment circuit 96 directly generates SS such that SS=ISCK. For illustration, the events are described in sequence; while in normal operations, many of these events may occur simultaneously.

One first sets the sampling threshold $TH_{SR}$ of the D flip-flop 80 and the phase shift of the sample clock SCK such that the sampling point 76 is within the eye 72 of the degraded data signal, preferable at the center of the eye. Generally, this location is known from the clock recovery circuit 69, since the phase or delay lock loops lock onto the edges of the data signal stream. One can make these adjustments by instructing the controller 68 to provide to the DAC 82 and phase adjustment circuit 86 digital values that respectively represent the desired levels of $TH_{SR}$ and phase shift.

After setting the sampling threshold $TH_{SR}$ of the D flip-flop 80 and the phase shift of SCK, the controller 68 sets the sampling threshold $TH_{SC}$ of the flip-flop 90 and the phase shift of SS to respective initial levels that provide a starting sampling point $101_{0,0}$, which is near the sampling location for D flip-flop 80. The controller 68 makes these adjustments by providing to the DAC 92 and phase adjustment circuit 96 digital values that respectively represent the initial sampling threshold $TH_{SR0}$ and phase shift, and one may preload these digital values into the controller 68. Although the starting sampling point $101_{0,0}$ is described as being inside of the eye 72, the starting sampling point may be located anywhere inside or outside of the eye pattern 66, as long as the controller 68 sweeps this sampling point over the eye pattern in a manner that allows the controller to map the boundary 70 for any given BER.

Next, the data-clock recovery circuit 69 generates a first active edge (here a rising edge) $110_0$ of DCK.

Then the phase adjustment circuit 96 generates a first sampling edge (here a rising edge) $112_0$ of SS after the phase imparted by the circuit 96.

Next, in response to the first sampling edge (here rising edge) $112_0$ of SS, the flip-flop 90 samples the degraded data signal and generates the test digital signal having a corresponding logic level. For example, if the level of the degraded data signal is higher than the initial sampling threshold $TH_{SC0}$ of the flip-flop 90, then the flip-flop generates the test digital signal having a logic 1 level. Conversely, if the level of the degraded data signal is lower than $TH_{SC0}$, then the flip-flop 90 generates the test digital signal having a logic 0 level. Furthermore, the first sampling edge $112_1$ of SS enables the comparator 406.

Then, the phase adjustment circuit 86 generates an initial sampling edge (here a rising edge) $114_0$ of SCK after the phase that the circuit 86 imparts to the edge $110_0$ of DCK.

Next, in response to the sampling edge $114_0$ of SCK, the flip-flop 80 samples the degraded data signal and generates the recovered digital signal having a corresponding level. For example, if the level of the degraded data signal is higher than the sampling threshold $TH_{SR}$ of the flip-flop 80, then the flip-flop generates the recovered digital signal having a logic 1 level. Conversely, if the level of the degraded data signal is lower than $TH_{SR}$, then the flip-flop 80 generates the recovered digital signal having a logic 0 level.

Then, in response to the second active edge (here rising edge) $110_1$ of DCK, the synchronizer 104 stores the levels of the test and recovered digital signals from the output nodes 88 and 102 of the flip-flops 80 and 90, respectively and realigns in time the test data signal of flip-flop 90, as well as the recovered data signal of flip-flop 80 relative to DCK.

Next, in response to the third active edge (here rising edge) $110_2$ of DCK, the comparator 106 compares the levels of the recovered and test digital signals, increments the counter 108 if the levels are not equal, and does not alter the count value if the levels are equal.

Furthermore, the phase adjustment circuits 86 and 96 generate subsequent edges $112_0$ and $114_0$ of SS and SCK, respectively, in response to the edges $110_1$ and $110_2$ of DCK, and the flip-flops 80 and 90 continue sampling the degraded data signal in response to these subsequent edges $112_0$ and $114_0$ such that the circuits 62 and 64, the synchronizer 104, and the comparator 106 operate in a pipelined fashion.

Then, by analyzing the rate at which the comparator 106 increments the counter 108 for the sampling point $101_{0,0}$, the controller 68 can determine whether the point $101_{0,0}$ is inside or outside of the eye boundary 70. As discussed above, the sampling point 76 of the data-signal-recovery circuit 62 is within the eye boundary 70 of the degraded data signal. Consequently, the level of the test digital signal equals the level of the recovered digital signal with an error rate that is less than the error rate defined for the boundary 70 when the sampling point $101_{0,0}$ is also within the eye boundary 70. Conversely, the level of the test digital signal equals the level of the recovered digital signal with an error rate that is greater than the error rate defined for the boundary 70 when the sampling point $101_{0,0}$ is outside of the eye boundary 70. For example, if the degraded data signal has a logic 1 level, then an error occurs where the data-signal-recovery circuit 62 (sampling point 76) generates a logic 1 level for the recovered digital signal but the data-signal-characterization circuit 64 (sampling point $101_{0,0}$) generates a logic 0 level for the test digital signal. Therefore, by comparing the counting rate of the counter 108 to the predetermined error threshold defined for the boundary 70, the controller 68 can determine whether the sampling point $101_{0,0}$ is inside or outside of the eye boundary 70. That is, if the count rate is below the error threshold for the boundary 70, then the sampling point $101_{0,0}$ is within the eye boundary 70; otherwise, the sampling point $101_{0,0}$ is outside of the eye boundary 70 as shown in FIG. 4.

Next, the controller 68 increments the detection threshold of the flip-flop 90 to $TH_{SC1}$ and the phase adjustment setting of the phase shifter 96, and repeats the above-described procedure for subsequent sample edges of DCK. This next sampling point is denoted as $101_{1,1}$ in FIG. 4.

This process is repeated over m settings of detection threshold to flip-flop 90, and n settings of phase adjustments for circuit 96, corresponding to sampling point $101_{m,n}$ in FIG. 4.

Then, the controller 68 determines the location of the boundary 70 from the locations of the sampling points $101_{m,n}$ and their corresponding value of the error counter rate.

After the controller 68 has determined the boundary 70 for one given BER, the entire process can be repeated to yield multiple contours of boundaries 70 of various BER values.

Next, using the boundary 70 locations, the controller 68 calculates the optimum sampling point within the eye 72 where the BER is minimum, and sets the sampling threshold $TH_{SR}$ of the flip-flop 80 and the phase shift of SCK such that the sampling point 76 is at this desired position. For purposes of illustration, the optimum sampling point is shown to be at the geometric center (i.e., the center of a two-dimensional area) 78 of the eye 72, Often, the optimum sampling point is not at the center of the eye 72.

Other embodiments of the invention are contemplated. For example, the controller 68 may decrement one or both of $TH_{SC}$ and the phase shift of SS instead of incrementing them, or may vary them randomly or in some other manner. Furthermore, the controller 68 may not analyze every sampling point $101_{0,0}$-$101_{m,n}$, and may generate the points 101 in other than a grid pattern. Moreover, the comparator 106 may alter the error count when the test digital signal is other than equal to the recovered digital signal.

Still referring to FIGS. 3 and 4, the operation and cooperation of the data-signal-recovery and characterizing circuits 62 and 64 are discussed according to an embodiment of the invention where the characterizing circuit 64 includes the sample-signal generator 98. Generally, the generator 98 allows the flip-flop 90 to operate at a sampling rate that is less than the frequency of DCK. This lower-speed operation may provide a significant power savings, particularly where the characterizing circuit 64 continually monitors the eye 72.

The generator 98 receives ISCK—ISCK has the same frequency as, but typically a different phase than, DCK—and generates the sampling edges 112 of SS every $k^{th}$ active edge of ISCK, where k is an integer that is greater than or equal to 1; thus, the generator 98 generates SS having a frequency equal to ISCK/k. Consequently, the synchronizer 104 and comparator 106 operate at the lower frequency of SS, and thus typically use less power than when operating at the higher frequency of DCK. If k is a constant greater than 1 and the degraded data signal carries a periodic data pattern, then reducing the frequency of SS may cause the controller 68 to accurately characterize the eye 72 for only this particular combination of k and the data pattern. To prevent this, the controller 68 or the generator 98 may periodically vary k such as by periodically generating a random number and setting k equal to this number. Depending upon the structure of the generator 98, this random number may be an integer or any rational number. Where the random number is an integer, then the variation of the period of SS is considered to be random within the context that it is limited to being an integer multiple of the period of ISCK. In this manner, the controller 68 reduces the correlation between SS and the periodic data pattern. But other than potentially reducing and/or randomizing the frequency of SS, the characterizing circuit 64 operates as discussed above.

The controller 68 may perform one or both of the above-described calibration procedures (i.e., k=1, k>1) according to a variety of schedules. For example, the controller 68 may determine the eye boundary 70 and calibrate the data-signal-recovery circuit 62 only as part of an initialization routine that the receiver 60 executes when first activated. Or, the controller 68 may periodically determine the boundary 70 and calibrate the recovery circuit 62 throughout the operation of the receiver 60. Furthermore, the controller 68 may set k=1 during the initialization routine, and may set k to another constant or varying value thereafter.

The sampling signal generator can also be an independent pseudo-random number generator, preset with sequences, which may or may not be altered by the controller 68.

The Status Monitor bus, containing the threshold settings of DAC's 82 and 92, the delay settings of the phase shifters 86 and 98, as well as other states of the controller, are ported externally to the integrated circuit. This allows an external test instrument to observe and characterize the eye boundary 70 of embedded inputs of the flip-flops 80 and 90, which are otherwise unobservable externally. This ability enables the external test instrument to display and further process the measured boundary 70, which is a value-adder to the consumer.

Figure 5:
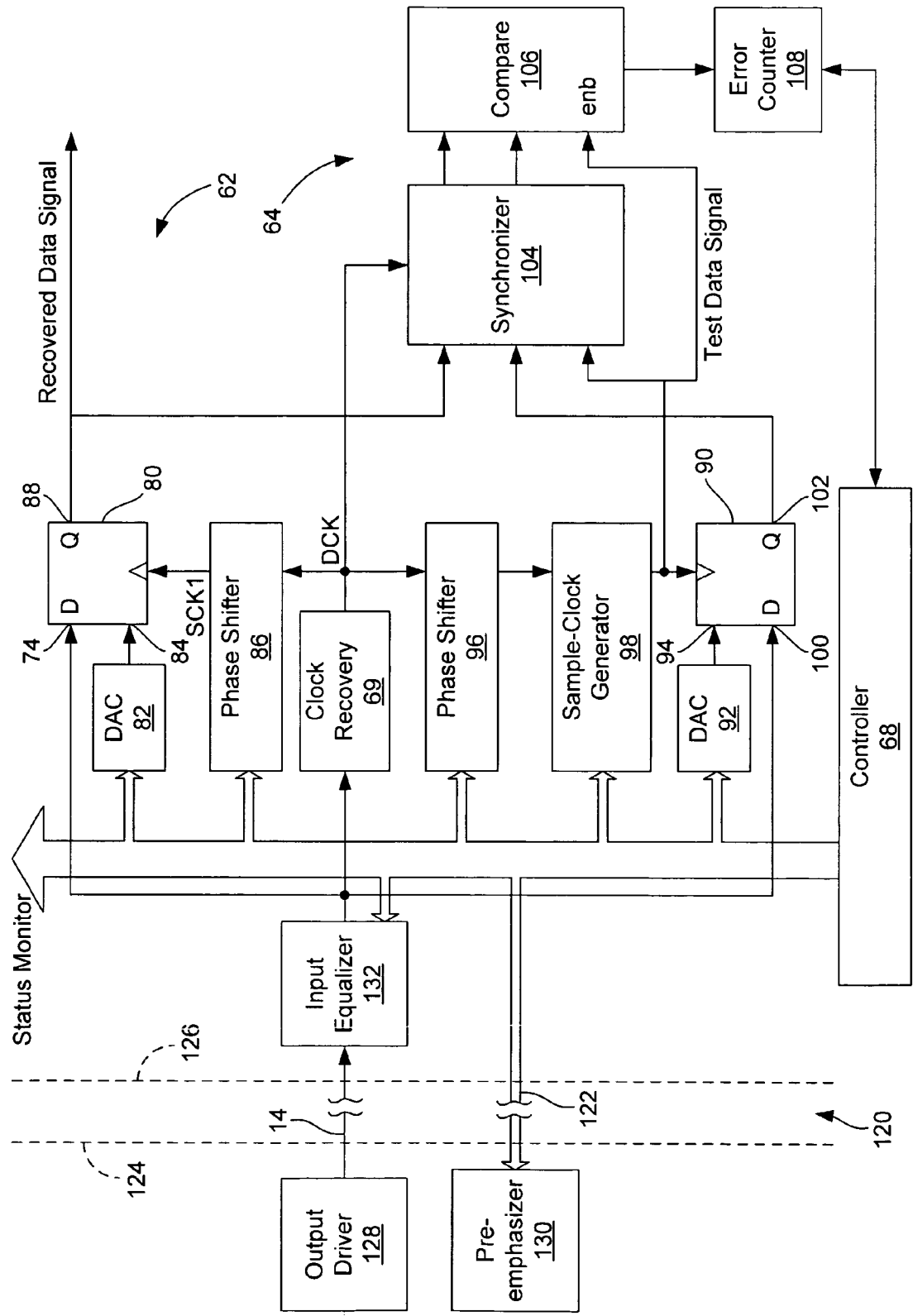
FIG. 5 is a block diagram of a communication system that uses feedback to control the characteristics of a data signal according to an embodiment of the invention.

FIG. 5 is a block diagram of a communication system 120 that includes transmission media 14 and 122, a transmitter 124, and a receiver 126 according to an embodiment of the invention. Although the media 14 and 122 are shown as being separate, they may be part of the same medium. For example, the media 14 and 122 may be respective PC board traces of a back-plane, or optical fibers in a fiber-optic cable. Since the speed requirement of controller 68 to preemphasis circuit 130 is relatively slow, and has less stringent requirements, the media 122 could also be completely separate from media 14.

The transmitter 124 includes an output driver 128 for generating the data signal, and includes a pre-emphasis circuit 130 operable to control the characteristics of the data signal via the output driver in response to the controller 68, which communicates with the pre-emphasis circuit via the medium 122. Generally, the pre-emphasis circuit 130 emphasizes frequencies that the transmission medium degrades. For example, the pre-emphasis circuit 130 may cause the output driver 128 to amplify higher frequencies more than lower frequencies to offset the transmission medium's greater attenuation of higher frequencies relative to lower frequencies. Therefore, with the proper settings (which dictate the pre-emphasis circuit's transfer function), the pre-emphasis circuit 130 can lessen the degradation of the data signal, and thus improve the characteristics (e.g., size, shape) of the eye 72 (FIG. 4) at the input nodes 74 and 100 of the D flip-flops 80 and 90, respectively. Because pre-emphasis circuits are well known, a more detailed discussion of the pre-emphasis circuit 130 is omitted for brevity.

The receiver 126 is the same as the receiver 60 of FIG. 3 except that it includes an equalizer 132 for equalizing the degraded data signal and providing the equalized signal to the data-signal-recovery and -characterizing circuits 62 and 64. Like the pre-emphasis circuit 130, with the proper settings (which dictate the equalizer's transfer function), the equalizer 132 can lessen the degradation of the data signal, and thus improve the characteristics (e.g., size, shape) of the eye 72 (FIG. 4) at the input nodes 74 and 100 of the D flip-flops 80 and 90, respectively. Because equalizers are well-known, a more detailed discussion of the input equalizer 132 is omitted for brevity.

Referring to FIGS. 4 and 5, in operation, the controller 68 first calculates the boundary 70 of the eye 72 and places the sampling point 76 of the data-signal-recovery circuit 62 within the eye as discussed above in conjunction with FIGS. 3 and 4.

Next, the controller 68 adjusts the settings of the pre-emphasis circuit pre-emphasis circuit 130 and/or the settings of the equalizer 132 to change the characteristics of the eye 72. For example, such changes may include increases or decreases in the area, symmetry, height, and/or width of the eye 72.

Then, the controller 68 re-calculates the boundary 70 of the eye 72 and re-centers the sampling point 76 of the data-signal-recovery circuit 62.

The controller 68 may repeat the steps of adjusting the pre-emphasis circuit pre-emphasis and equalizer settings, calculating the boundary 70, and readjusting the sampling point 76 for a predetermined number of iterations, until the eye 72 meets a predetermined characteristic profile, until the controller determines that further iterations will likely yield levels of improvement that are below a predetermined improvement threshold, or according to another halt-calibration algorithm.

Figure 6:
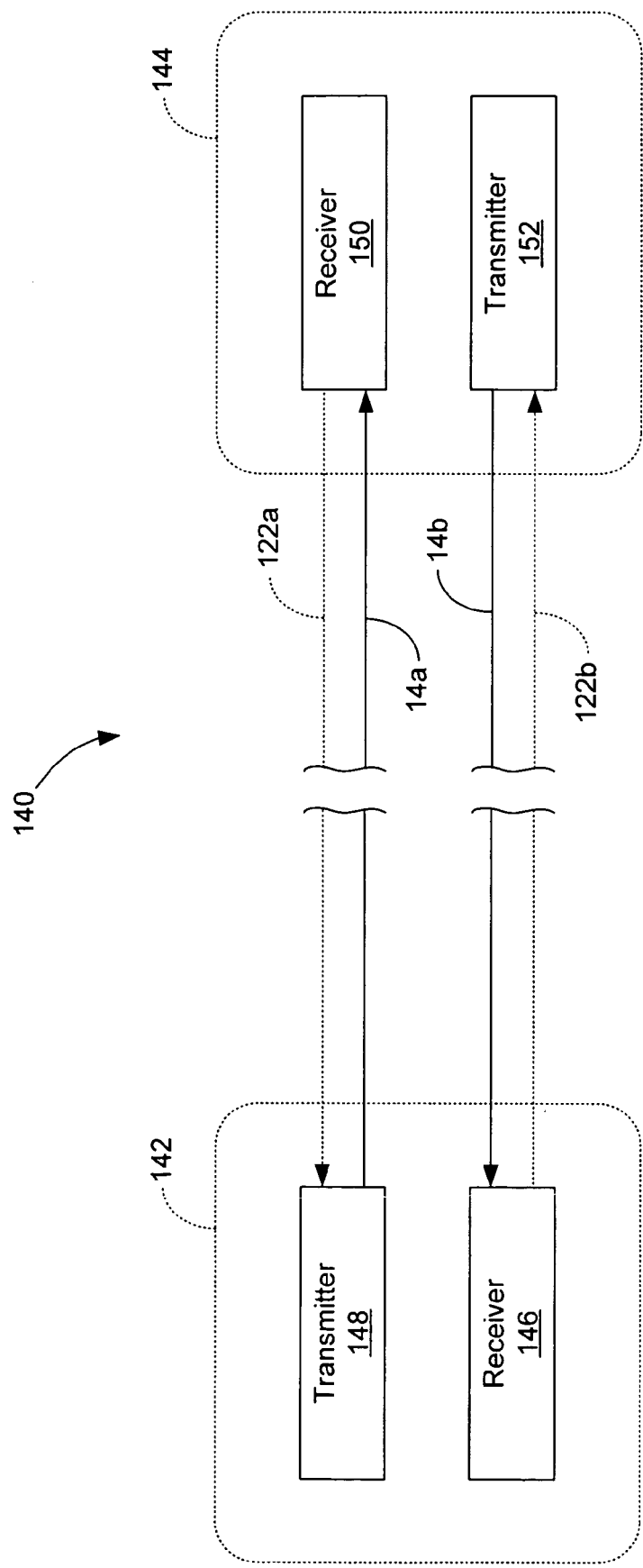
FIG. 6 is a block diagram of a communication system that uses feedback to control the characteristics of a data signal according to another embodiment of the invention.

FIG. 6 is a block diagram of a bi-directional communication system 140 that characterizes the signal eyes and calibrates the sampling points at both ends of the system according to an embodiment of the invention. The system 140 includes transmission media 14a and 14b and optional media 122a and 122b, a first transmitter/receiver 142, and a second transmitter/receiver 144. Although the media 14a, 14b, 122a, and 122b are shown as being separate, they may be part of the same medium. For example, the media 14a, 14b, 122a, and 122b may be respective PC board traces of a backplane, or optical fibers in a fiber-optic cable.

The first transmitter/receiver 142 includes a first receiver 146 and a first transmitter 148, which may be similar to the receiver 126 and the transmitter 124, respectively, of FIG. 5.

Similarly, the second transmitter/receiver 144 includes a second receiver 150 and a second transmitter 152, which may be similar to the receiver 126 and the transmitter 124, respectively, of FIG. 5.

In operation of the system 140 according to an embodiment of the invention, the first receiver 146 adjusts the pre-emphasis circuit 130 (FIG. 5) of the second transmitter 152 via the medium 122b, and the second receiver 150 adjusts the pre-emphasis circuit pre-emphasis circuit 130 (FIG. 5) of the first transmitter 144 via the medium 122a as discussed above in conjunction with FIG. 5. The first and second receivers 146 and 150 may also send other respective eye-related information to the second and first transmitters 152 and 144 via the media 122b and 122a, respectively.

In operation of the system 140 according to another embodiment of the invention, the media 122a and 122b are omitted, the first receiver 146 adjusts the pre-emphasis circuit 130 (FIG. 5) of the second transmitter 152 via the medium 14b, and the second receiver 150 adjusts the pre-emphasis circuit 130 (FIG. 5) of the first transmitter 144 via the medium 14a as discussed above in conjunction with FIG. 5. The first and second receivers 146 and 150 may also send other respective eye-related information to the second and first transmitters 152 and 144 via the media 14a and 14b, respectively. The receivers 146 and 150 may employ known techniques for preventing the eye-related information from destructively interfering with the respective data signals generated by the transmitters 152 and 148. Such techniques include encoding this information so that it is uncorrelated with the data signal or sending this information in a frequency band that is outside of the data signal's frequency band.

Figure 7:
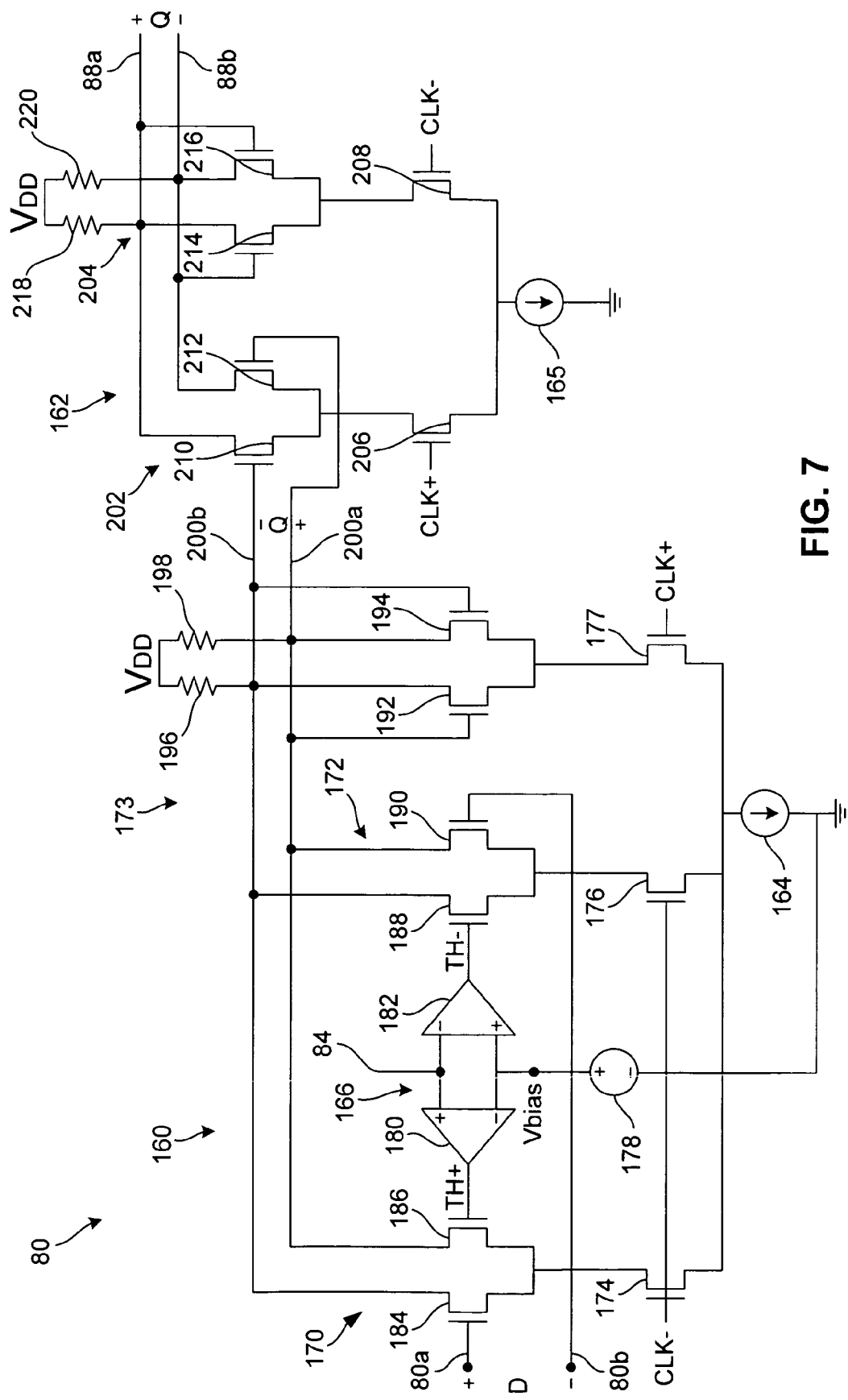
FIG. 7 is a schematic diagram of the flip-flops of FIGS. 3 and 5 according to an embodiment of the invention.

FIG. 7 is a schematic diagram of the D flip-flops 80 and 90 of FIGS. 3 and 5 according to an embodiment of the invention. In this embodiment, the flip-flops 80 and 90 fully differential, that is, both the inputs 74 and 94 and the outputs 88 and 100 are differential. Furthermore, for clarity of discussion, the D flip-flop 80 is shown and discussed in detail, it being understood that the flip-flop 90 is similar.

The flip-flop 80 includes a fully differential master input stage 160, a fully differential slave output stage 162, and main current sources 164 and 165, which sink current from both the input and output stages, respectively.

The master input stage 160 respectively receives the positive and negative components D+ and D− of the degraded data signal on input nodes $80_a$ and $80_b$, and provides the components Q+ and Q− of the recovered differential digital signal Q* on intermediate nodes $200_a$ and $200_b$.

In addition to the current source 164, the stage 160 includes a threshold-adjust circuit 166, first and second input sensing substages 170 and 172, an latch substage 173, and current switches 174, 176, and 177, which respectively receive complementary signals CLK+ and CLK−. The threshold-adjust circuit 166 includes a voltage source 178 for generating $V_{bias}$, and includes differential amplifiers 180 and 182, which receive $V_{bias}$ and the threshold-adjust signal (from the DAC 82 of FIG. 3 via the node 84) and which respectively generate the positive and negative components TH+ and TH− of the sampling threshold $TH_{SR}$, where TH+ and TH− have levels that correspond to the level of the threshold-adjust signal 84.

The value of $V_{bias}$ is set to be at the common-mode value of the D+ 80a and D− 80b inputs. In a typical receiver system, the inputs are AC coupled, and $V_{bias}$ could be used to directly set the DC common-mode bias voltages of the D+ 80a and D− 80b nodes via biasing resistors.

The first sensing substage 170 includes a first differential pair of transistors 184 and 186 for comparing D+ to TH+, and the second substage 172 includes a second differential pair of transistors 188 and 190 for comparing D− to TH−. When CLK=logic 0, the substages 170 and 172 sum the results of these respective comparisons on the intermediate nodes 200a and 200b to generate Q*=(Q*+)−(Q*−) When CLK=logic 1, the latching substage stage 173 latches the recovered digital signal Q* across the nodes 200a and 200b. The stage 173 includes a differential pair of transistors 192 and 194, pull-up impedances 196 and 198, and the current source 177, which receives the signal CLK+.

The slave output stage 162 respectively receives the positive and negative components of Q*=(Q*+)−(Q*−) from the master stage 80 via the nodes $200_a$ and $200_b$, respectively, and provides the components Q+ and Q− of the recovered digital signal Q=(Q+)−(Q−) on the output nodes $88_a$ and $88_b$.

In addition to the current source 165, the stage 162 includes an sensing substage 202, an latching substage 204, and current sources 206 and 208, which respectively receive complementary signals CLK+ and CLK−. The sensing substage 202 includes a first differential pair of transistors 210 and 212 for comparing Q*+ to Q*− and generating Q=(Q+)−(Q−) across the nodes $88_a$ and $88_b$ when CLK=logic 1. The latching substage 204 maintains the recovered digital signal Q across the output nodes $88_a$ and $88_b$ when CLK=logic 0. The stage 204 includes a differential pair of transistors 214 and 216, pull-up impedances 218 and 220, and the current switches 206 and 208, which are coupled to the current source 165.

Still referring to FIG. 7, the operation of the flip-flop 80 is discussed.

First, the controller 68 sets the levels of TH+ and TH− via the threshold-adjust node 84 as discussed above in conjunction with FIG. 3. Specifically, TH+=K1($V_{84}$−$V_{bias}$) and TH−=K2($V_{bias}$−$V_{84}$), where $V_{84}$ is the adjust voltage at the node 84, K1 is the gain of the amplifier 180, and K2 is the gain of the amplifier 182. Typically K1=K2 such that TH+=−(TH−). But one may set K1 and K2 to different values so as to unbalance the threshold-adjust circuit 166 in a desired manner. For example, one may unbalance the circuit 166 if the degraded data signal across the nodes $80_a$ and $80_b$ is unbalanced.

Next, while CLK=logic 0 (inactive) and CLK*=logic 1 (active), the current switches 174 and 176 are active, and thus the differential substages 170 and 172 are operational.

When (D+)>(TH+) and (D−)<(TH−), the transistors 184 and 188 conduct significantly more current than the transistors 186 and 190 such that the voltage on the intermediate node $200_b$ is less than the voltage on the intermediate node $200_a$.

Conversely, when (D+)<(TH+) and (D−)>(TH−), the transistors 186 and 190 conduct significantly more current than the transistors 184 and 188 such that the voltage on the node $200_a$ is less than the voltage on the output node $200_b$.

Then, when CLK transitions to logic 1 (active) and CLK* transitions to logic 0 (inactive), the latching substage 173 amplifies the difference Q*=(Q+)−(Q−), and latches this amplified difference. Specifically, the current sources 174 and 176, and thus the differential substages 170 and 172, are inactive, but the current source 177, and thus the output substage 173, is active. Therefore, the transistors 192 and 194 amplify and latch the voltage levels Q*+ and Q*− on the nodes 200$_a$ and 200$_b$. For example, as discussed above, when (D+)>(TH+) and (D−)<(TH−), the voltage Q− on the node 200$_b$ is less than the voltage Q*+ on the output node 200$_a$. Consequently, the transistor 192 draws more current than the transistor 194, and positive feedback causes the transistor 192 to eventually pull down the node 200$_b$ to a low voltage level and causes the impedance 198 to eventually pull up the node 200$_a$ to a higher voltage level such that Q*=logic 1 ((Q*+)>(Q*−)). Conversely, when (D+)<(TH+) and (D−)>(TH−), the voltage Q*+ on the node 200$_a$ is less than the voltage Q*− on the node 200$_b$. Consequently, the transistor 194 draws more current than the transistor 192, and positive feedback causes the transistor 194 to eventually pull down the node 200$_a$ to a low voltage level and causes the impedance 196 to eventually pull up the node 200$_b$ to a higher voltage such that Q*=logic 0 ((Q*+)<(Q*−)).

Also when CLK transitions to a logic 1, the current switch 206 is active, and thus the input substage 202 of the slave stage 162 differentially amplifies Q* across the nodes 200$_a$ and 200$_b$, and thus generates Q across the output nodes 88$_a$ and 88$_b$ of the flip-flop 80. When CLK transitions back to logic 0, the current switch 206 is inactive, but the current switch 208 is active, and thus the latching substage 204 maintains Q across the output nodes 88$_a$ and 88$_b$.

The preceding discussion is presented to enable a person skilled in the art to make and use the invention. Various modifications to the disclosed embodiments, such as extensions to multiple channel applications, will be readily apparent to those skilled in the art, and the generic principles herein may be applied to other embodiments and applications without departing from the spirit and scope of the invention. Thus, the present invention is not intended to be limited to the embodiments shown, but is to be accorded the widest scope consistent with the principles and features disclosed herein.

What is claimed is:

1. A data signal recovery circuit in a receiver, comprising:
   a data signal conditioner configured to alter a parameter of an input data signal;
   a first sampling flip-flop configured to receive the conditioned data signal and, in response to a sample clock signal, configured to generate a recovered digital signal having a first level if the conditioned data signal is above a first threshold provided by the first threshold circuit and having a second level if the conditioned data signal is below the first threshold;
   a second sampling flip-flop comprising a second threshold circuit, the second sampling flip-flop being configured to receive the conditioned data signal, and, in response to the sample clock signal, being configured to generate a test digital signal having a third level if the conditioned data signal is above a second threshold provided by the second threshold circuit and having a fourth level if the conditioned data signal is below the second threshold; and
   a controller coupled to the data signal conditioner and to the first and second sampling flip-flops and configured to monitor the parameter of the data signal and to control the altering of the parameter in response to the recovered digital signal and test digital signal;
   wherein the first threshold circuit is integrated into and forms a portion of the first sampling flip-flop and the second threshold circuit is integrated into and forms a portion of the second sampling flip-flop such that delays and phase shifts occurring between the first threshold circuit and the first flip-flop, and between the second threshold circuit and the second flip-flop, are minimized, and such that the data signal recovery signal circuit can operate in the receiver at high weed with little or no delay, little or no phase shifts, and low amplitude distortion.

2. The data signal recovery circuit of claim 1, wherein the controller is further operable to sweep a phase of the sample clock signal relative to the data clock through a first range and to sweep the second threshold through a second range.

3. The data signal recovery circuit of claim 1, wherein the data signal conditioner comprises an equalizer.

4. The data signal recovery circuit of claim 1, wherein the data signal conditioner comprises a pre-emphasis circuit.

5. The data signal recovery circuit of claim 1, wherein:
   the data-signal conditioner is disposed on a first integrated circuit; and
   the first and second sampling flip-flops and the control circuit are disposed on one or more integrated circuits that are separate from the first integrated circuit.

6. The data signal recovery circuit of claim 1, wherein the controller is operably coupled to the sampler and is operable to sweep a phase of an intermediate clock signal relative to a data clock signal through a first range, to generate the sample clock signal in response to respective predetermined edges of the intermediate clock signal, to detect an error when the test digital signal has a predetermined relationship to the recovered digital signal, and to identify a boundary of an eye of the input data signal in response to an error-detection rate.

7. The data signal recovery circuit of claim 1, further comprising a phase shifter coupled between the first or second sampling flip-flops and the controller and configured to generate a predetermined phase shift in the sample clock signal relative to the data clock signal.

8. The data signal recovery circuit of claim 1, further comprising a clock recovery circuit operably coupled to the phase shifter and configured to recover the data clock signal from the input data signal.

9. The data signal recovery circuit of claim 1, wherein the third level equals the first level and the fourth level equals the second level.

10. The data signal recovery circuit of claim 1, wherein the sample clock signal has a random period.

11. The data signal recovery circuit of claim 1, wherein the sample clock signal has a pseudo-random period.

12. The data signal recovery circuit of claim 1, wherein the sample clock signal has a substantially constant first period and an intermediate clock has a substantially constant second period that is different than the first period.

13. The data signal recovery circuit of claim 1, further comprising a synchronizer coupled to the first and second sampling flip-flops and operable to synchronize the recovered digital signal and the test digital signal to the data clock; and
   a comparator coupled to the synchronizer and to the controller and operable to compare the synchronized recovered and test digital signals.

14. The data signal recovery circuit of claim 1, wherein the controller is further configured to adjust the phase of the sample clock signal and the first or second thresholds such that a sampling point defined by a sampling edge of the sample clock signal and the first threshold is within an eye of the input data signal.

* * * * *